United States Patent [19]

Shannon

[11] Patent Number: 5,466,617
[45] Date of Patent: Nov. 14, 1995

[54] MANUFACTURING ELECTRONIC DEVICES COMPRISING TFTS AND MIMS

[75] Inventor: John M. Shannon, Whyteleafe, England

[73] Assignee: U.S. Philips Corporation, New York, N.Y.

[21] Appl. No.: 260,502

[22] Filed: Jun. 15, 1994

Related U.S. Application Data

[63] Continuation of Ser. No. 25,546, Mar. 3, 1993, abandoned.

[30] Foreign Application Priority Data

Mar. 20, 1992 [GB] United Kingdom ............... 9206086

[51] Int. Cl.$^6$ .............................................. H01L 21/786
[52] U.S. Cl. .................. 437/40; 437/51; 437/84; 437/173; 437/247; 148/DIG. 91; 148/DIG. 150
[58] Field of Search ........................................ 437/40, 173

[56] References Cited

U.S. PATENT DOCUMENTS

| | | | |
|---|---|---|---|
| 4,732,801 | 3/1988 | Joshi | 437/241 |
| 4,755,256 | 7/1988 | Ditchek | 437/173 |
| 4,962,065 | 10/1990 | Brown et al. | 437/247 |
| 5,130,263 | 7/1992 | Possin et al. | 437/40 |
| 5,166,556 | 11/1992 | Hsu et al. | 437/922 |
| 5,183,780 | 2/1993 | Noguchi et al. | 437/173 |
| 5,279,880 | 1/1994 | Hikichi et al. | 437/40 |

FOREIGN PATENT DOCUMENTS

| | | |
|---|---|---|
| 182484 | 5/1986 | European Pat. Off. . |
| 202092 | 11/1986 | European Pat. Off. . |
| 333392 | 9/1989 | European Pat. Off. . |
| 62-31111 | 2/1987 | Japan ............ 437/101 |
| 1135028 | 5/1989 | Japan ............ 437/967 |
| 3200319 | 9/1991 | Japan ............ 437/967 |
| 2213987 | 8/1989 | United Kingdom . |
| 2231200 | 11/1990 | United Kingdom . |
| 2244860 | 12/1991 | United Kingdom . |

OTHER PUBLICATIONS

"A Laser–Recrystalliation Technique for Silicon–TFT Integrated Circuits on Quartz Substrates and Its Application to Small–Size Monolithic Active–Matrix LCD's", IEEE Trans. Electron Devices, vol. 37, No. 1, Jan. 1990, pp. 121–127.
"High–Voltage Poly–Si TFT's with Multichannel Structure", IEEE Trans. Electron Devices, Vo. 35, No. 12, Dec. 1988, pp. 2363–2367.

*Primary Examiner*—Brian E. Hearn
*Assistant Examiner*—Michael Trinh
*Attorney, Agent, or Firm*—John C. Fox

[57] ABSTRACT

Body portions (36) of semiconductor crystalline silicon material of sufficient quality to form high-mobility TFTs (thin-film transistors) and other semiconductor devices of a driver circuit are formed by depositing on a substrate (14) a layer of insulating silicon-based non-stoichiometric compound material (32) and then converting this material (32) into the semiconductive crystalline material (36) by heating with an energy beam (40), for example from an excimer laser. The use of an energy beam (40) permits easy localization of the heating (and consequent conversion) both vertically and laterally. The deposition (e.g. by plasma-enhanced chemical vapour deposition) and the beam annealing can both be carried out without heating the substrate (14) to high temperatures, and so a glass or other low-cost substrate (14) can be used. An unconverted part (32a) underlying the crystalline silicon body portion (36) can form at least part of a gate insulator of the TFT. The deposited non-stoichiometric compound material may be of a type suitable for forming a MIM-type switching device so that unconverted areas (42) of the insulating material (32) may be retained for that purpose. This permits the fabrication of an LCD device comprising a picture-element array of MIM type devices in the unconverted material (32) of the layer and TFT driver circuitry in the crystalline silicon material (36) of the layer.

29 Claims, 2 Drawing Sheets

MANUFACTURING ELECTRONIC DEVICES COMPRISING TFTS AND MIMS

This is a continuation of application Ser. No. 08/025,546, filed Mar. 3, 1993, now abandoned.

BACKGROUND OF THE INVENTION

This invention relates to methods of manufacturing an electronic device comprising at least one semiconductor device (for example a thin-film transistor) which has a body portion of semiconductive crystalline silicon material formed by annealing with an energy beam, and further relates to devices manufactured by such methods. The invention relates particularly but not exclusively to the manufacture of electronic devices wherein the semiconductor devices provide circuitry for driving an array of switching devices formed on the same substrate as the semiconductor devices. Such switching devices may be of the MIM-type, and the electronic device may be, for example, a liquid-crystal display or a data store.

For very many years amorphous-silicon thin-film transistors (TFTs) were used as the switching devices in an array for actively controlling the operation of the picture elements of a liquid-crystal display. In more recent years MIM-type devices have been used instead of thin-film transistors, because the MIM-type devices have only two terminal electrodes and are comparatively simple to manufacture.

A MIM type device is a type of switching diode having a non-linear current-voltage characteristic through one or more layers of insulating material between two metallic (i.e. conductive) layers which form the diode electrodes. Hence the acronym "MIM" is derived from the English "Metallic-Insulative-Metallic". Published United Kingdom patent applications GB-A-2 213 987 and U.S. Pat. No. 5,236,573, and published European patent applications EP-A-0 182 484, EP-A-0 202 092 and EP-A-0 333 392 describe the fabrication of MIM-type diodes with non-stoichiometric silicon-based compounds, for example silicon nitride, silicon oxide, silicon oxynitride and/or silicon carbide as the insulative material, and further describe their use as switching devices in arrays for the active matrix addressing of a liquid-crystal display. The MIM-type diodes in the array are switched on by applying sequentially a moderately high scanning voltage signal (for example in the range of 10 to 15 volts) to row conductors of the display. The whole contents of GB-A-2 213 987, GB-A-2 231 200, EP-A-0 182 484, EP-A-0 202 092, and EP-A-0 333 392 are hereby incorporated herein as reference material.

Preferably the driving circuitry for addressing such an array is integrated on the same substrate as the array so as to reduce the number of external connections. Typically the substrate is of a low-cost material such as a glass or plastics material, and so only low-temperature processing steps should be used to fabricate the driving circuitry. Therefore preferably the semiconductor device technology used to fabricate the driving circuitry should not involve heating the substrate (at least for any significant time) to temperatures above, for example, about 700° C.

When the switching array is formed of thin-film transistors, the driving circuitry can also be formed of thin-film transistors integrated on the display substrate(s). Thus, row drivers may be formed with thin film transistors having a sufficiently high mobility to allow the row conductors to be scanned at, for example, about 30 kHz for a television display device. In simple terms, the field-effect mobility needs to be in excess of about 1 $cm^2.V^{-1}.s^{-1}$ to achieve this scanning rate, and this high mobility can be achieved in crystalline silicon material formed by depositing a layer on a substrate and annealing at least a part of the layer with an energy beam. Specific examples using a CW argon laser beam are described in the articles "High-voltage polysilicon TFTs with multi-channel structure" by T. Unagami in IEEE Transactions on Electron Devices Vol. 35 No. 12, December 1988, pages 2363 to 2367, "Low Temperature Fabrication of Poly-Si TFT by Laser Induced Crystallization of a-Si" by Masumo et. al. in Journal of Non-Crystalline Solids Vol. 115 (1989) pages 147 to 149, and "A laser-recrystallization technique for silicon-TFT integrated circuits on quartz substrates, and its application to small-size monolithic active-matrix LCDs" by E. Fujii et. al. in IEEE Transactions on Electron Devices Vol. 37 No. 1, January 1990, pages 121 to 127. The whole contents of all these articles are hereby incorporated herein as reference material. In this known laser-annealed device process technology, the deposited layer is of semiconductive amorphous or small-grain silicon and is annealed into large-grain polycrystalline silicon (polysilicon) by heating with the laser beam. This technology provides satisfactory TFTs to form the driving circuitry of the TFT switching array.

However, the driving circuits for a MIM device array cannot be fabricated as MIM-type devices, and so a different device technology with different materials is required on the substrate when the switching array is formed of MIM-type devices.

OBJECTS AND SUMMARY OF THE INVENTION

It is an aim of the present invention to mitigate this disadvantage of incompatibility of MIM device technology with driving-circuit device technology, and in particular to provide an alternative way of forming suitable semiconductive material for semiconductor devices in a manner which may still be compatible with low-temperature processing for the device substrate(s).

The present invention is based on a surprising discovery by the present inventor that body portions of semiconductive crystalline silicon material of a sufficient quality to form high-mobility thin-film transistors and other semiconductor devices can be formed by (a) depositing a layer of insulating silicon-based non-stoichiometric compound material and then (b) converting this material into the semiconductive crystalline silicon material by heating with an energy beam.

Thus, according to the present invention, there is provided a method of manufacturing an electronic device comprising at least one semiconductor device which has a body portion of semiconductive crystalline silicon material, wherein the silicon crystalline material is formed by depositing a layer on a substrate and annealing at least a part of the layer with an energy beam, which method is characterised in that the layer is deposited as an insulating non-stoichiometric compound material of silicon alloyed with at least one other element, and in that at least a part of the insulating non-stoichiometric compound material is converted into the semiconductive crystalline silicon material by heating that part with the energy beam.

A versatile device process technology results from the use of an energy beam to convert the insulating compound material into semiconductive crystalline silicon material, and the resulting process technology can be maintained compatible with individual low-temperature requirements for processing particular low-cost substrates. The whole layer may be converted to the semiconductive silicon material. However, the wavelength and energy of the beam (for example most conveniently from a laser) and the area of the layer exposed thereto can be controlled so as to control which parts of the deposited layer are converted and which parts are not converted. This permits localization of the conversion in the vertical direction of the thickness of the layer and in the longitudinal direction of the surface area of the layer.

Thus, by selectively masking or directing the energy beam, a first area of the deposited layer may be annealed with the energy beam to provide the semiconductive crystalline silicon material for the semiconductive device, and a second area of the deposited layer which is not subjected to the energy beam may be retained on the substrate as insulating non-stoichiometric compound material in the manufactured electronic device. This second area may provide a simple insulating function in the manufactured device, for example between active semiconductor devices or device areas.

However the present inventor has also discovered that the deposited layer of insulating non-stoichiometric compound material may be of a type suitable for forming a MIM-type switching device, for example a non-stoichiometric silicon nitride, silicon oxide, silicon oxynitride and/or silicon carbide. Indeed, from the insulating materials already used for forming MIM devices, silicon-rich ranges may be selected for conversion into semiconductive crystalline silicon by annealing with an energy beam in accordance with the present invention. Thus, the present inventor has also devised a method of fabricating high-mobility semiconductor devices such as row-driver thin-film transistors in a manner compatible with the manufacture of a MIM switching array. A first area of the layer of insulating non-stoichiometric compound material may be converted by the energy beam into the semiconductive crystalline silicon material for a thin-film transistor or other semiconductor device, whereas a second area is retained and provided with two electrodes to form a MIM-type switching device on the substrate.

The exposed area(s) of the deposited layer may be converted throughout the layer thickness into the semiconductor crystalline silicon material. However the use of an energy beam permits the choice of a short beam-wavelength having an absorption depth in the deposited layer which is so much less than the thickness of the deposited layer that the insulating non-stoichiometric compound material is converted into semiconductive crystalline silicon material over only a part of its thickness. This reduces the heating of the substrate by the energy beam and is particularly useful for forming the devices on a low-cost low-temperature substrate. The underlying unconverted part may be used to provide an insulating interface between the semiconductive crystalline silicon material and the substrate.

However, an underlying unconverted part of the layer may be used as an active part of the semiconductor device. Thus, for example, the semiconductor device may be a thin-film transistor having a gate which is formed on the substrate before depositing the layer; in this case the semiconductor crystalline silicon material provides a channel region of the transistor, and an unconverted part of the insulating non-stoichiometric compound material may provide at least a part of a gate insulator between the underlying gate and the overlying channel region. This provides a simple method for fabricating an insulated-gate TFT.

BRIEF DESCRIPTION OF THE DRAWINGS

These and other features in accordance with the invention are illustrated specifically in embodiments of the invention now to be described, by way of example, with reference to the accompanying diagrammatic drawings. In these drawings.

Figure 1:
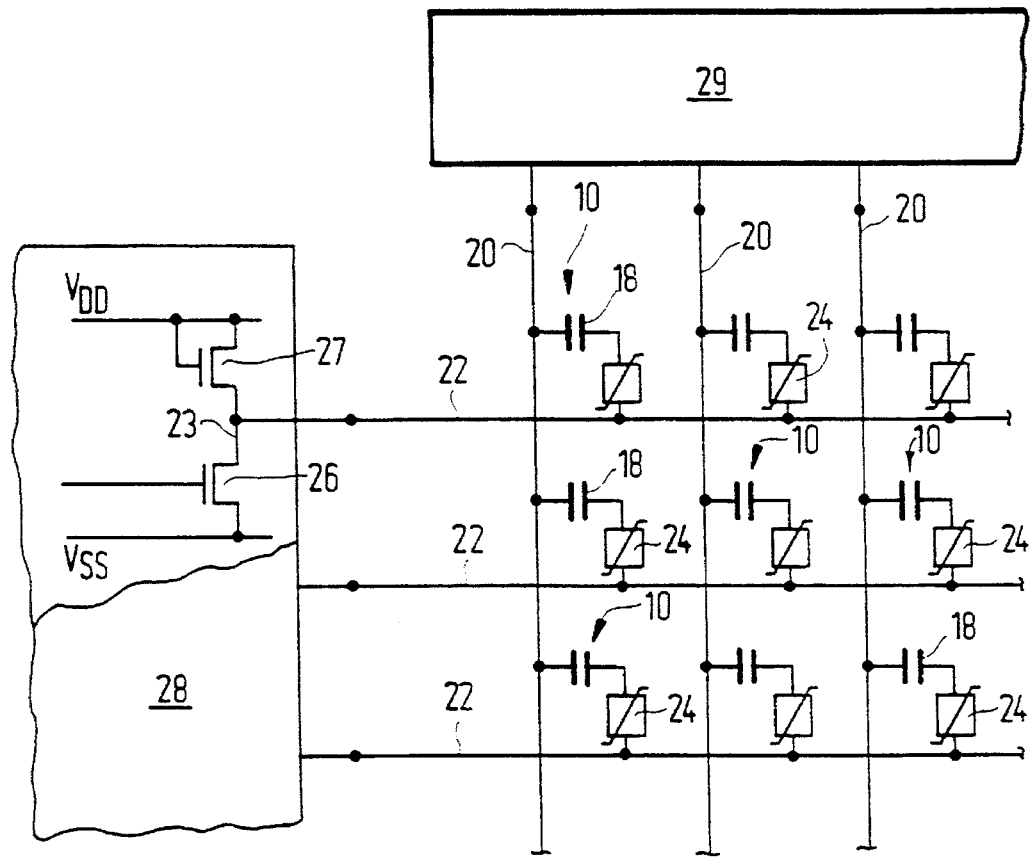
FIG. 1 is a partial circuit diagram of part of a liquid-crystal display device including a MIM switching array driven by TFT circuitry.

It should be noted that all the drawings are diagrammatic and not drawn to scale. Relative dimensions and proportions of parts of the Figures have been shown exaggerated or reduced in size for the sake of clarity and convenience in the drawings. The same reference signs are generally used to refer to corresponding or similar features in the different embodiments.

DESCRIPTION OF THE PREFERRED EMBODIMENTS

Figure 2:
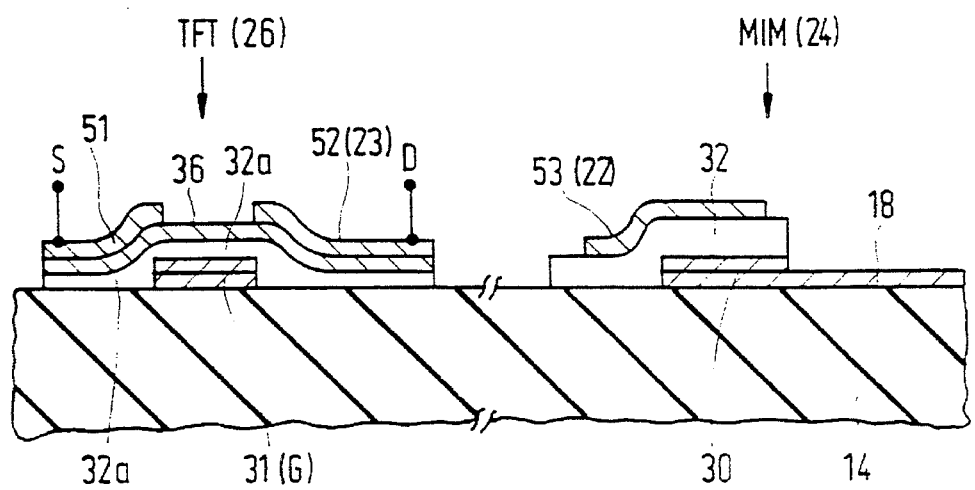
FIG. 2 is a cross-sectional view of part of one substrate of the display device of FIG. 1 and showing a MIM switching device and a TFT driver formed on different areas of the substrate by using manufacturing steps in accordance with the present invention.

Except for the manner in which its MIM switching devices and TFT driving circuitry is fabricated, the liquid-crystal display device of FIG. 1 is similar to that of FIGS. 1 and 2 of GB-A-2 213 987. The device has a row and column matrix array of individual picture elements 10, only a few of which are shown in FIG. 1 for simplicity. In practice there may be $10^5$ or more such elements, for example in the case of a television display. Each element is defined by a pair of electrodes carried on facing surfaces of two spaced substrates (for example of glass or other low-cost insulating material) with liquid-crystal material therebetween. The picture-element array is located over the main central area of the substrates, whereas driving circuits 28 and 29 are located at peripheral areas.

More particularly, one substrate 14 (shown in FIG. 2) carries an array of individual transparent electrodes 18 which are each generally rectangular and which are arranged together in rows and columns. Each individual electrode 18 defines the area of a respective picture element 10. The substrate 14 also carries a switching array of MIM devices 24 (integrated with the picture-element electrodes 18), a set of parallel row-address conductors 22, and row-driver circuitry 28 (for example the thin-film transistors 26 and 27).

The opposite substrate (not shown in the present drawings) carries a set of parallel column-address conductors 20 connected to column-driver circuitry 29. The column-address conductors 20 extend at right angles to the row conductors 22. Where they overlie picture-element electrodes 18, the conductors 20 constitute the other electrodes of the picture elements 10.

The picture-element electrodes 18 of all picture elements in the same row are connected to a respective row-address conductor 22 (FIGS. 1 and 2) via associated series-connected two-terminal non-linear switching elements in the form of MIM devices 24. Although only one MIM device is shown for each picture element, two or more MIM devices 24 could be associated with each picture element 10 in known manner.

The individual picture elements 10 are addressed in conventional fashion using scamping signals applied from the circuit 28 to each row conductor 22 in turn, and video data signals are applied appropriately, in synchronism to the column conductors 20 from the circuit 29 to modulate light transmission through the picture elements in accordance with video information. The elements 10 are energised on a row at a time basis so as to build up a display picture, e.g. a TV picture over one field.

The display device and its operation are similar to known display devices using MIM type non-linear switching devices. Accordingly, the description of the device is deliberately brief, and for the most part the row and column driver circuitry is illustrated simply as circuit blocks 28 and 29 comprising known circuits. For a TV display, the row driver circuit 28 typically functions at about 30 kHz, whereas the column driver circuit 29 functions at about 11 MHz. Both the row and column driver circuits may be formed with thin-film transistors. By way of example, FIG. 1 illustrates two TFTs 26 and 27 connected in an inverter configuration to drive a row-address conductor 22.

Because the low-cost substrates are not able to withstand device-processing at high temperatures, the substrate process steps used to provide the picture-element array and the driving circuits thereon involves only low substrate temperatures. The TFTs of the row driver circuit 28 are fabricated on the substrate 14 using manufacturing steps in accordance with the present invention. Thus, for example the TFT 26 is formed in accordance with the present invention, and comprises a body portion 36 of semiconductive crystal silicon material having a field-effect mobility in excess of 1 $cm^2V.^{-1}s^{-1}$ so as to function satisfactorily as a row driver transistor. The other substrate with its column drive circuitry 29 and column conductors 20 may be produced in known manner.

Figure 4:
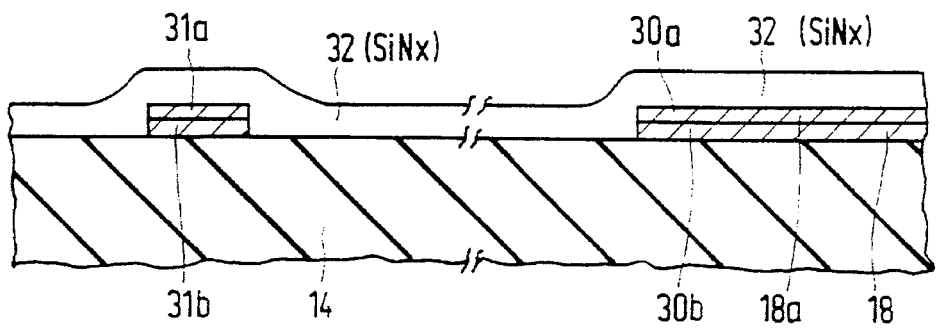
Figure 5:
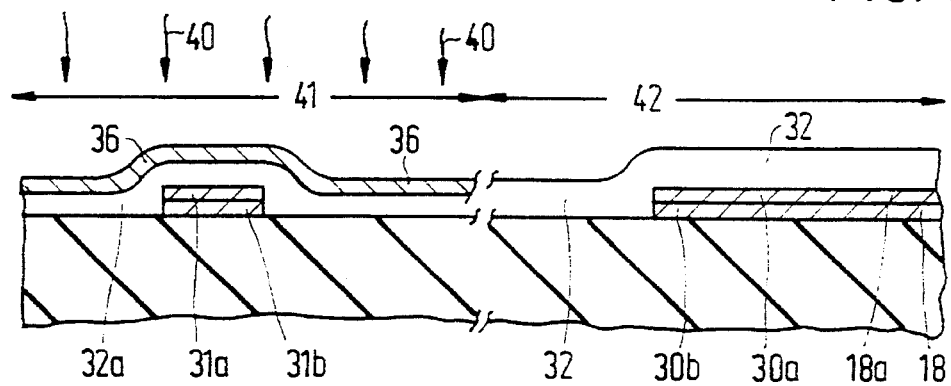

Thus, in accordance with the present invention, the manufacture of the display device includes the steps of (a) depositing on the substrate 14 a layer 32 of insulating non-stoichiometric compound material of silicon alloyed with at least one other element (FIG. 4), and (b) annealing a part of that layer 32 with an energy beam 40 (for example from an excimer laser) to convert that part 36 into the semiconductive crystalline silicon material by heating with the energy beam 40 (FIG. 5).

Figure 3:
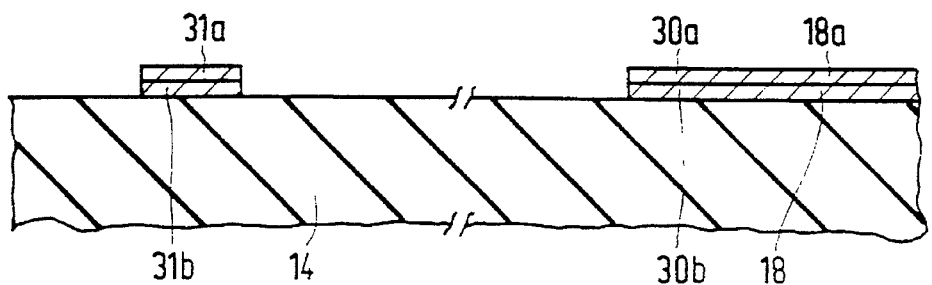
FIGS. 3 to 5 are cross-sectional views of the device part of FIG. 2 at successive stages in the manufacture.

FIGS. 3 to 5 illustrate stages in the manufacture of the TFT 26 and MIM 24 of FIG. 2 using a particular method in accordance with the invention which requires only three photolithographic mask alignment steps. In this method one or more peripheral areas 41 of the deposited layer 32 (corresponding to the areas of the drive circuitry 28) are annealed with the energy beam 40 to provide the semiconductive crystalline silicon material for the body portions of TFTs 26, 27 etc., while one or more central areas 42 of the deposited layer 32 (corresponding to the picture display area) are not exposed to the energy beam 40 and are retained on the substrate 14 as the insulating non-stoichiometric compound material of the MIM devices 24.

In this particular example, the TFT 26 is of the so-called "inverted staggered type" having its gate electrode 31 adjacent to the substrate 14, and the MIM device 24 is of the vertical type having one electrode 30 also adjacent to the substrate 14. These electrodes 30 and 31 are formed in known manner by depositing conductive material on the substrate 14, photolithographically defining the areas to be retained, and etching away the excess material.

In the specific example illustrated in FIGS. 2 to 5, both the electrodes 30 and 31 comprise two layers, for example an opaque metal 30a and 31a (such as chromium) on another material 30b and 31b which may be, for example, a transparent layer of indium tin oxide (ITO). In this specific case, the MIM electrode part 30b of the final device as shown in FIG. 2 may be a small chromium-coated extension of a larger uncoated ITO area 18 which provides the picture-element electrode. At the stage illustrated in FIGS. 3 to 5 however, this ITO electrode area 18 may still be coated with a corresponding chromium area 18a which is later removed. However, other arrangements are possible in which the ITO is not present below a TFT gate electrode 31a and MIM electrode 30a but overlaps the edge of the MIM electrode 30a to connect the MIM 24 to the transparent picture-element electrode 18 of ITO.

The insulating non-stoichiometric compound material 32 is now deposited on the substrate 14 and over the electrode pattern 18, 30 and 31 at a suitably low temperature. The material 32 may be, for example, non-stoichiometric silicon nitride ($SiN_x$), non-stoichiometric silicon oxynitride ($SiN_xO_y$), non-stoichiometric silicon oxide ($SiO_x$), and/or non-stoichiometric silicon carbide ($SiC_x$). The non-stoichiometric nature of the material 32 arises from an excess silicon content (i.e. greater than the stoichiometric ratio of the compound) and a deficiency of the other element, and this facilitates the conversion of the insulating material 32 upon heating with the energy beam 40 into the semiconductive crystalline silicon material 36 for the body portions of the TFTs 26, 27 etc. Preferably the deposited material 32 also contains a high hydrogen content so that hydrogen is retained in the converted material 36 to passivate the crystal grain boundaries. Furthermore, the lattice defects due to the non-stoichiometric nature of the retained insulating material 32 have a significant role in providing the switchable non-linear current-voltage behaviour of the MIM devices 24 whereby their resistance is high at low applied voltages and drops significantly at higher applied voltages to allow adequate current to flow therethrough for the purpose of driving the picture elements 10.

The insulating non-stoichiometric material 32 may be deposited onto a glass substrate 14 using a plasma-enhanced low-pressure chemical vapour deposition (PECVD) process. In the case of silicon nitride, for example, a gaseous mixture of silane ($SiH_4$) and nitrogen ($N_2$) and hydrogen ($H_2$) may be used for the PECVD. The gases are introduced into the plasma CVD reaction chamber for example at a pressure of 1 Torr (133 Pascal) and in proportions suitable to produce a silicon-rich silicon nitride material having both the desired non-linear electrical characteristics for the MIM devices 24 and the desired crystalline-silicon conversion characteristics for the TFTs 26 etc. The temperature of the glass substrate 14 is comparatively low during the deposition, for example about 200° C. (degrees Celsius) which is well below the softening point of the glass. Depending on the desired device characteristics for both the MIMs 24 and TFTs 26, the thickness of the deposited layer 32 may be in the range of 20 to 200 nm (nanometers), for example about 100 nm (i.e. 103 Angstroms).

In the case of plasma CVD of silicon oxynitride, a gaseous mixture of silane and ammonia ($NH_3$) and nitrous oxide ($N_2O$) may be used. For plasma enhanced CVD of a non-stoichiometric silicon carbide, a gaseous mixture of silane and hydrogen and methane ($CH_4$) may be used. It is also possible to use other material deposition techniques instead of PECVD, for example sputter deposition. Thus, for example, silicon-rich non-stoichiometric silicon carbide, silicon oxide and/or silicon nitride may be deposited by reactive sputtering of a silicon target or silicon-compound target with ions using a gaseous mixture of argon with oxygen, nitrogen and other gases containing O, N and C. It is also possible to provide the layer 32 as a combination of non-stoichiometric materials for example in different layers one above the other or mixed together, and this provides a further means for controlling the desired properties of the devices 24, 26 etc.

FIG. 4 illustrates the substrate after the deposition of the insulating non-stoichiometric layer 32. In the next stage which is illustrated in FIG. 5, a first area 41 where the TFTs 26, 27 etc are to be formed is annealed with a laser beam 40 to form polycrystalline silicon in this area 41, whereas a second area 42 where the array of MIMs 24 and picture-element electrodes 18 are to be formed is not exposed to the laser beam so that the insulating non-stoichiometric material 32 is retained unconverted in this second area 42. This first area 41 of the substrate 14 is mechanically scanned through the laser beam 40 which may typically have a width of about 6 mm. The dimensions (together with the positioning of the substrate 14 in the laser equipment) are such that there is no need for any mask over the picture-element array area 42 to prevent it from exposure to the laser beam 40.

Preferably an excimer laser is used in the specific example of FIGS. 2 to 5, so as to generate the beam 40 at an ultraviolet wavelength (for example at 248 nm for a KrF laser) having a shallow absorption depth in the deposited layer 32. The thickness of the crystalline silicon produced by the laser beam 40 is much deeper than the absorption depth which is typically about 6 nm (60 Angstroms) for excimer ultraviolet wavelengths. The greater depth of crystallization is due to the strong heating effect of the absorbed energy apparently leading to a melting of the material 32. The melting of the material results in some reduction of the other-element (i.e. non-silicon) content of the material, apparently by gaseous evolution. Thus, in the case of a silicon nitride layer 32, some compositional change occurs with loss of some of the nitrogen content by evolution of $N_2$ gas. By varying the incident laser energy in the range 100 to 300 mJ.cm$^{-1}$ per pulse, the depth over which the insulating material 32 is converted into semiconductive crystalline silicon material 36 can be varied from less than 10 nm (100 Angstroms) to about 60 or 70 nm (600 to 700 Angstroms).

Thus, in the specific example of FIGS. 2 to 5, the thickness of the semiconductive crystalline silicon body portion 36 of the TFT 26 can be controlled by controlling the laser energy. The gate insulator of this TFT 26 is provided by the unconverted insulating material 32a between the underlying gate 31 and overlying crystalline silicon 36 of the TFT channel region, and so the thickness of the gate insulator 32a can be determined by appropriate choice of the original thickness of the deposited layer 32 and of the energy of the laser beam 40.

The structure of FIG. 5 is then further processed in known manner to define the body portions for the MIM devices 24 and TFTs 26 etc. This involves a photolithographic and etching stage for etching away excess areas of the layers 32, 36 and 32a. In removing the insulating material 32 from over the picture-element electrode 18, the chromium area 18a is exposed and is now etched away so that this picture-element area becomes transparent.

A further photolithographic and etching stage is then carried out to provide a pattern of conductor tracks 22, 23 etc. and electrodes 51, 52, 53 etc. as top connections and interconnections for the TFTs 26, 27 etc. and the MIM devices 24. The top electrodes 51, 52, 53 etc. may be of, for example, chromium. The electrodes 51 and 52 are provided on the semiconductor crystalline silicon material 36 of the TFT channel region and form the source and drain of the TFT 26. The electrodes 53 are provided on the insulating material 32 of the MIM device 24 and provide the second terminal of the MIM.

The crystalline silicon material. 36 produced by heating the insulating material 32 with the laser beam 40 is of surprisingly good quality for producing semiconductor devices, in spite of the material 32 having been deposited at a low temperature. Spectroscopy measurements show that polycrystalline silicon material of large grain size is produced.

In a particular example an amorphous non-stoichiometric silicon nitride material 32 formed by the described PECVD process was heated with a KrF excimer laser beam of 248 nm wavelength operated at a low duty cycle of a few hertz with a pulse width of 20 ns and an energy of 200 mJ.cm$^{-2}$ per pulse; the resulting crystalline silicon material consisted of silicon crystal grains with some $Si_3N_4$ inclusions in the layer structure. The average crystal grain size at the surface of the crystalline material 36 is found to increase with increasing incident energy in the range 150 to 250 mJ.cm$^{-2}$ per pulse, and this results in an increase in the field-effect mobility, for example in the range of 5 to 15 cm$^2$.V$^{-1}$.s$^{-1}$. The silicon crystalline material 36 was also thought to be hydrogenated by retention of some of the hydrogen content of the PECVD material 32. This hydrogen content appears to improve the device quality of the material 36 by passivating the silicon crystal grain boundaries in the material 36 and by passivating the interface between the crystallized silicon material 36 and the underlying part 32a of unconverted insulating material 32 (for example in the TFT gate insulator structure).

As regards the composition of the crystallized silicon layer 36, it appears to consist of silicon crystal grains with some $Si_3N_4$ inclusions. Some of the nitrogen content of the original material 32 has been lost from the crystallized material 36 apparently by evolution of $N_2$ gas during the molten phase. Furthermore, some n-type doping of the crystallized silicon 36 by the nitrogen also seems to occur. The conductivity of the crystallized silicon 36 can be controlled by including p-type dopant to at least partially compensate for the nitrogen doping. Alternatively, nitrogen doping of the silicon 36 can be reduced or avoided by using a diffferent starting material 32, for example silicon oxynitride, silicon oxide or silicon carbide etc.

It will be evident that many modifications and variations are possible. Thus, for example while retaining the inverted staggered configuration for the TFT 26 in FIGS. 2 to 5, a part of the gate insulator may be provided as a further insulating layer formed on the gate 31 (FIG. 3) before depositing the MIM layer 32 of insulating non-stoichiometric compound material (FIG. 4). This further insulating layer may be deposited, or it may be formed by converting the surface of the metal gate for example by anodisation or oxidation of a tantalum, or aluminium or titanium gate 31. This permits the provision of a very high quality dielectric for the gate insulator, and any remaining part 32a of the insulating non-stoichiometric material not converted by the beam 40 may serve to reduce strain between the overlying crystalline silicon material 36 and underlying the gate insulator. In this case, it is even possible to convert the material 32 to semiconductive crystalline silicon material over its whole thickness while retaining the further insulating layer as the sole gate insulator of the TFT 26. Such a further insulating layer may also be provided over the MIM electrode 30 in FIG. 3 and serve in the final MIM device 24 to further control the non-linear resistance characteristics of this device.

In the embodiment of FIGS. 2 to 5, the unconverted part 32a of the insulating non-stoichiometric compound material not only provides at least part of the gate insulator in the channel area of the TFT 26 but also provides an interface between the semiconductive crystalline silicon material 36 and the substrate 14 in the areas beyond the channel area. This interface 32a may reduce strain between the overlying crystalline silicon material 36 and the underlying substrate 14. Furthermore converting the layer 32 into crystalline silicon material over only a part of its thickness is advantageous in preserving good adhesive of the layers 32, 36 etc. to the substrate 14. Thus, for example, the applicants have also annealed layers 32 using an argon laser operating in the visible green wavelength region (instead of ultraviolet from an excimer laser) and find that although the layer 32 is converted through its thickness there is a tendancy for the converted layer 36 to peel away from the substrate 14. This tendancy to peel appears to result from strong heating of the substrate during the exposure of the overlying layer 32 to the laser beam, even though that exposure is of short duration. The penetration depth of this argon laser beam 40 is several times that of an excimer laser.

Figure 6:
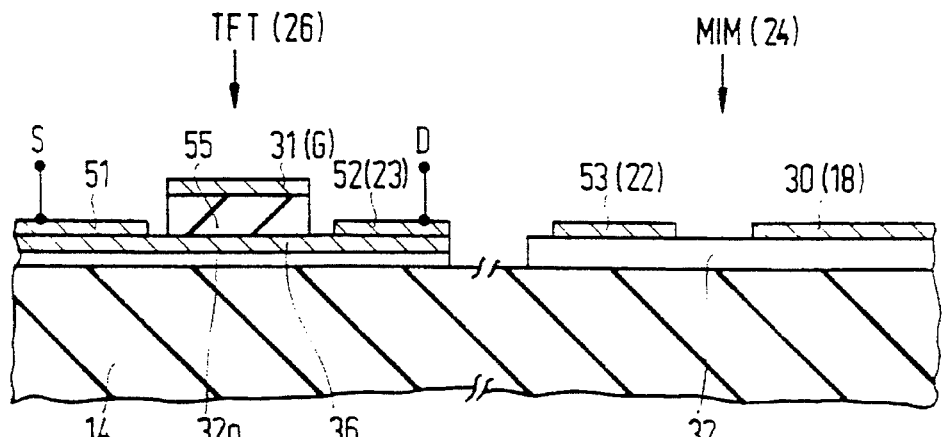
FIG. 6 is a cross-sectional view of a part of one substrate of another display device and showing other types of MIM switching device and TFT driver formed on the substrate by using manufacturing steps in accordance with the invention.

FIG. 6 illustrates another embodiment in which the layer 32 is converted into crystalline silicon material 36 over only a part of its thickness so as to leave an insulating interface 32a with the substrate 14. In this embodiment no electrodes are formed on the substrate 14 (compare with FIG. 3) before depositing the layer 32 (compare with FIG. 4), and after the conversion treatment with the beam 40 (compare with FIG. 5) all the device electrodes for the TFT 26 and MIM 24 are provided on the top face of the layers 36 and 32. Thus, a TFT 26 of the so-called "coplanar" type is formed having source and drain electrodes 51 and 52, a gate insulator 55 and gate 31. This TFT 26 may be fabricated on the converted silicon layer 36 in a similar manner to that described in published European patent application EP-A-0 523 768 published on 20th January 1993 and having a GB priority date of 28th June 1991. The whole contents of EP-A-0 523 768 (our reference PH33727) are hereby incorporated herein as reference material. The MIM 24 is of the lateral type in this embodiment, and may be fabricated on the retained insulating non-stoichiometric compound material 32 in a similar manner to that described in published United Kingdom patent application GB-A-2 244 860 (our reference PHB33633), the whole contents of which are hereby incorporated herein as reference material.

FIG. 1 illustrates an embodiment of the present invention in the manufacture of a liquid-crystal display device in which a liquid-crystal film is encapsulated between the substrate 14 and another substrate carrying the column conductors 20 and having the column driving circuitry 29. The display may be for an instrument panel or for a personal computer display panel or for a television receiver. Instead of a liquid crystal material, a display device manufactured in accordance with the present invention may be designed to operate with another electro-optical material (for example, an electropheretic suspension or electrochromic material) between the two substrates.

Furthermore, instead of a display device, a different type of electronic device may be manufactured in accordance with the present invention. Thus, for example, the device may be an image sensor having a switching array of MIM devices 24 which serves for addressing an image sensing array and which is driven by circuitry comprising TFTs fabricated in semiconductive crystalline silicon material 36 formed in accordance with the invention. In another form, the electronic device manufactured in accordance with the invention may be a data store comprising a switching array of MIM devices 24 which serves for addressing an array of storage devices (for example, capacitors). The switch array of such a data store may be addressed by transverse sets of column and row conductors 20 and 22, both of which may be carried on the same substrate 14. In this case both the row and column circuitry 28 and 29 may be formed in semiconductive crystalline silicon material 36 provided in accordance with the present invention on the same substrate 14.

In the embodiments of FIGS. 2 to 6, the semiconductor devices formed in the semiconductive crystalline silicon material 36 are thin-film transistors having an insulated gate (31, 32a) as its control electrode. However other semiconductor devices may be fabricated, for example a semiconductor diode. A bipolar thin-film transistor may be formed having a base contact as its control electrode for controlling current flow through a base region formed in the semiconductive crystalline silicon material.

Having regard to desired characteristics for a MIM device 24, the insulating non-stoichiometric compound material 32 may comprise a dopant element such as phosphorus, for example as disclosed in EP-A-0 202 092. The inclusion of the dopant element in the material 32 can also be advantageous for a semiconductor device 26, in doping the semiconductive crystalline silicon material 36 which is formed from the material 32 by annealing with a laser beam 40 in accordance with the present invention.

In the embodiments of FIGS. 2 to 6, areas of the insulating non-stoichiometric compound material 32 are retained to form the switchable MIM devices 24. However the present invention may be used to manufacture devices without MIM devices. Thus, any retained insulating material 32 may be used for another purpose, for example for electrical insulation between active devices or between device circuitry areas which are formed in the semiconductive crystalline silicon material. Furthermore semiconductive crystalline silicon material 36 formed in accordance with the present invention may be used to form semiconductor devices in the switching array of a display or imaging device or data store, if so desired.

In the embodiments described with reference to FIGS. 2 to 6, a laser was used to generate the energy beam 40. A laser beam is particularly convenient for controlling the annealing and heating conditions. However, other forms of energy beam (for example an electron beam or high-power lamps) may be used to fabricate the semiconductive crystalline silicon material 36 from the insulating non-stoichiometric compound material 32. Thus, the conversion to crystalline silicon material may be effected by a short-duration exposure to very high intensity lamps, and a stencil mask plate may be used to localize this exposure so as to protect areas 42 which are not to be converted.

From reading the present disclosure, other variations and modifications will be apparent to persons skilled in the art. Such variations and modifications may involve equivalents and other features which are already known in semiconductor and thin film technologies and in the design, manufacture and use of displays and other large-area electronic devices and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of manufacturing an electronic device comprising at least one high mobility semiconductor device which has a body portion of high mobility semiconductive material of crystalline silicon, wherein the high mobility semiconductive crystalline material is formed by depositing a layer on a substrate and annealing at least a part of the layer only, with an energy beam, which method is characterized in that the layer is deposited as a layer of an insulating non-stoichiometric compound material of silicon alloyed with at least one other element, and that at least a part of the layer of the insulating non-stoichiometric material only is converted into the body portion of high mobility semiconductive crystalline material by heating only that part with the energy beam.

2. A method as claimed in claim 1, further characterised in that the insulating compound material is selected from the group consisting of non-stoichiometric silicon nitride, non-stoichiometric silicon oxynitride, and non-stoichiometric silicon carbide.

3. A method as claimed in claim 1, further characterised in that the insulating compound material is deposited with a hydrogen content, and a portion of the hydrogen is retained in the crystalline silicon material.

4. A method as claimed in claim 1, further characterised in that the semiconductor device is a thin-film transistor having a control electrode for controlling current flow through a part of the body portion of the semiconductive material of crystalline silicon.

5. A method of manufacturing an electron device comprising at least one MIM-type switching device and at least one semiconductor device other than an MIM-type switching device, wherein the semiconductor device other than an MIM-type switching device has a body portion of semiconductive material of crystalline silicon which is formed by depositing a layer on a substrate and annealing a part of the layer only, with an energy beam, which layer is deposited as an insulating non-stoichiometric compound material of silicon alloyed with at least one other element, at least a first area of the insulating non-stoichiometric compound material is converted into the semiconductive material of crystalline silicon by heating the first area of the deposited layer only, with the energy beam, and a second area of the deposited layer is not subjected to the energy beam and is retained on the substrate as insulating non-stoichiometric material, which second area is provided with two electrodes to form the MIM-type switching device on the substrate.

6. A method as claimed in claim 5, further characterised in that an array of the MIM-type switching devices is formed on the substrate and is connected to driving circuits also formed on the substrate, in that the MIM-type switching devices are formed with the insulating non-stoichiometric compound material, and in that the driving circuits comprise a plurality of the semiconductor devices having body portions of the semiconductive crystalline silicon material formed by annealing with the energy beam.

7. A method as claimed in claim 5, further characterized in that the insulating compound material ms selected from the group consisting of non-stoichiometric silicon nitride, non-stoichiometric silicon oxynitride, and non-stoichiometric silicon carbide.

8. A method as claimed in claim 6, further characterized in that the insulating compound material ms selected from the group consisting of non-stoichiometric silicon nitride, non-stoichiometric silicon oxynitride, and non-stoichiometric silicon carbide.

9. A method of manufacturing an electronic device comprising at least one semiconductor device which has a body portion of semiconductive crystalline material, wherein the silicon crystalline material is formed by depositing a layer on a substrate and annealing at least a part of the layer with an energy beam, which method is characterised in that the layer is deposited as an insulating non-stoichiometric compound material of silicon alloyed with at least one other element, in that at least a part of the insulating non-stoichiometric compound material is converted into the semiconductive crystalline silicon material by heating that part with the energy beam, and in that the energy beam is of a wavelength having an absorption depth in the deposited layer which is so much less than the thickness of the deposited layer that the insulating non-stoichiometric compound material is converted into semiconductive crystalline silicon material over only a part of its thickness.

10. A method as claimed in claim 9, further characterised in that the semiconductor device is a thin-film transistor having a gate which is formed on the substrate before depositing the layer, in that the semiconductive material of crystalline silicon provides a channel region of the transistor, and in that an unconverted part of the insulating non-stoichiometric compound material provides at least a part of a gate insulator between the underlying gate and the overlying channel region.

11. A method as claimed in claim 9, further characterised in that an underlying unconverted part of the insulating non-stoichiometric compound material provides an interface between the semiconductive material of crystalline silicon and the substrate, and in that the semiconductor device has at least one electrode which is provided on the semiconductive crystalline silicon material.

12. A method as claimed in claim 9, further characterised in that the energy beam is of an ultraviolet wavelength generated by an excimer laser.

13. A method as claimed in claim 9, further characterized in that the insulating compound material ms selected from the group consisting of non-stoichiometric silicon nitride, non-stoichiometric silicon oxynitride, and non-stoichiometric silicon carbide.

14. A method as claimed in claim 10, further characterized in that the energy beam is of an ultraviolet wavelength generated by an excimer laser.

15. A method as claimed in claim 10, further characterized in that the insulating compound material ms selected from the group consisting of non-stoichiometric silicon nitride, non-stoichiometric silicon oxynitride, and non-stoichiometric silicon carbide.

16. A method as claimed in claim 11, further characterized in that the energy beam is of an ultraviolet wavelength generated by an excimer laser.

17. A method as claimed in claim 11, further characterized in that the insulating compound material ms selected from the group consisting of non-stoichiometric silicon nitride, non-stoichiometric silicon oxynitride, and non-stoichiometric silicon carbide.

18. A method as claimed in claim 12, further characterized in that the insulating compound material is selected from the group consisting of non-stoichiometric silicon nitride, non-stoichiometric silicon oxynitride, and non-stoichiometric silicon carbide.

19. A method of manufacturing an electronic device comprising at least one semiconductor device in the form of a thin film transistor having a channel region in a body portion of semiconductor material of crystalline silicon, wherein the semiconductive material is formed by depositing a layer on a substrate and annealing at least a part of the layer only, with an energy beam, which method is characterized in that the layer is deposited as an insulating non-stoichiometric compound material of silicon alloyed with at least one other element, and that at least a part of the insulating non-stoichiometric compound material is converted into the semiconductive material for the channel region of the thin-film transistor by heating that part only, with the energy beam.

20. A method as claimed in claim 19, further characterised in that a first area of the deposited layer is annealed with the energy beam to provide the semiconductive crystalline silicon material for the channel region of the thin film transistor, and in that a second area of the deposited layer is not subjected to the energy beam and is retained on the substrate as insulating non-stoichiometric compound material of an MIM-type switching device in the manufactured electronic device.

21. A method as claimed in claim 20, further characterized in that the insulating compound material is selected from the group consisting of non-stoichiometric silicon nitride, non-stoichiometric silicon oxynitride, and non-stoichiometric silicon carbide.

22. A method as claimed in claim 19, further characterized in that the thin-film transistor has a gate which is formed on the substrate before depositing the layer, the energy beam is of a wavelength having an absorption depth in the deposited layer which is so much less than the thickness of the deposited layer that the insulating non-stoichiometric compound material is converted into semiconductive material of crystalline silicon over only a part of its thickness, and in that an unconverted part of the insulating non-stoichiometric compound material provides at least a part of a gate insulator between the underlying gate and the overlying semiconductive crystalline silicon material of the channel region.

23. A method as claimed in claim 22, further characterised in that, before depositing the layer of insulating non-stoichiometric compound material, an insulating layer is formed on the gate so as to provide a part of the gate insulator of the transistor.

24. A method as claimed in claim 22, further characterized in that an underlying unconverted part of the insulating non-stoichiometric compound material provides an interface between the semiconductive material of crystalline silicon and the substrate, and in that the thin film transistor has at least one electrode which is provided on the semiconductive material of crystalline silicon.

25. A method as claimed in claim 23, further characterized in that an underlying unconverted part of the insulating non-stoichiometric compound material provides an interface between the semiconductive crystalline silicon material and the substrate, and in that the thin film transistor has at least one electrode which is provided on the semiconductive material of crystalline silicon.

26. A method as claimed in claim 23, further characterized in that the energy beam is of an ultraviolet wavelength generated by an excimer laser.

27. A method as claimed in claim 23, further characterized in that the insulating compound material ms selected from the group consisting of non-stoichiometric silicon nitride, non-stoichiometric silicon oxynitride, and non-stoichiometric silicon carbide.

28. A method of manufacturing an electronic device comprising at least one high mobility semiconductor device, which semiconductor device has a body portion consisting of a semiconductive material of crystalline silicon, wherein the method comprises the steps of:

(a) depositing on a substrate a layer of an insulating non-stoichiometric compound material of silicon alloyed with at least one other element, and (b) annealing at least a part of the layer by heating that part only, with an energy beam, and so converting at least a part of the insulating non-stoichiometric compound material into the semiconductive material of crystalline silicon.

29. A method of manufacturing an electronic device comprising at least one high mobility semiconductor device, which semiconductor device is formed with a body portion consisting of a semiconductive material of crystalline silicon, wherein the method comprises the steps of:

(a) depositing on a substrate a layer of an insulating non-stoichiometric compound material of silicon alloyed with at least one other element, (b) annealing at least a part of the layer by heating that part only, with an energy beam and so converting at least a part of the insulating non-stoichiometric compound material into the semiconductive material of crystalline silicon, and (c) thereafter providing a pair of electrodes on the body portion consisting of the semiconductive material of crystalline silicon.

* * * * *